US006946885B1

(12) United States Patent
Rockot et al.

(10) Patent No.: US 6,946,885 B1
(45) Date of Patent: Sep. 20, 2005

(54) RIPPLE GATE DRIVE CIRCUIT FOR FAST OPERATION OF SERIES CONNECTED IGBTS

(75) Inventors: Joseph H. Rockot, North Huntington, PA (US); Thomas W. Murray, Holtsville, NY (US); Kevin C. Bass, Irwin, PA (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 10/440,225

(22) Filed: May 19, 2003

(51) Int. Cl.⁷ ............................................. H03K 17/00
(52) U.S. Cl. ...................................................... 327/124
(58) Field of Search .................. 363/51, 124; 327/108, 327/109, 124, 376, 377, 403–405, 407, 408, 327/411

(56) References Cited

U.S. PATENT DOCUMENTS 5,359,244 A * 10/1994 Hopkins ..................... 327/434
5,708,579 A * 1/1998 Donegan et al. ............ 363/124
5,969,964 A * 10/1999 Mangtani ..................... 363/132
6,222,744 B1 * 4/2001 Pernyeszi .................... 363/41
6,307,409 B1 * 10/2001 Wrathall ..................... 327/112
6,477,065 B2 * 11/2002 Parks ....................... 363/21.06
6,556,053 B2 * 4/2003 Stanley ....................... 327/108
6,703,874 B2 * 3/2004 Katoh et al. ................. 327/108

* cited by examiner

Primary Examiner—Matthew V. Nguyen
(74) Attorney, Agent, or Firm—Julia C. Moody; Paul A. Gottlieb

(57) ABSTRACT

A ripple gate drive circuit includes a plurality of transistors having their power terminals connected in series across an electrical potential. A plurality of control circuits, each associated with one of the transistors, is provided. Each control circuit is responsive to a control signal and an optical signal received from at least one other control circuit for controlling the conduction of electrical current through the power terminals of the associated transistor. The control circuits are responsive to a first state of the control circuit for causing each transistor in series to turn on sequentially and responsive to a second state of the control signal for causing each transistor in series to turn off sequentially.

4 Claims, 1 Drawing Sheet

RIPPLE GATE DRIVE CIRCUIT FOR FAST OPERATION OF SERIES CONNECTED IGBTS

GOVERNMENT INTERESTS

This invention was made with government support under a contract awarded by the United States Department of Energy. The government has certain rights in this invention.

BACKGROUND OF THE INVENTION

1. Field of the Invention

This invention relates to a circuit to sequentially turn on and off a series connected string of electronic devices with a minimum switching delay while limiting the voltage drop across each device.

2. Description of Related Art

The ability to operate insulated gate bipolar transistors (IGBTs) at high voltage, and thereby benefit from their high frequency capability, is limited by their specified voltage ratings. Previous art methods for operating IGBTs in series, where the voltage across the IGBTs is higher than the maximum voltage rating of each IGBT, include the use of a voltage clamp circuit across each IGBT, and a turn-on and turn-off sequence circuit that forces the system voltage to be applied across the IGBTs in a controlled order.

In operation, as the voltage across each IGBT increases, the corresponding voltage clamp circuit clamps the voltage to a maximum value. The process of the prior art uses a short, fixed delay to ensure that each IGBT is turned on or off before the next device in the series string is operated. This delay compensates for variations in the turn-on time of each IGBT but must be longer than the slowest IGBT turn-on time expected. This turn-on and turn-off delay method requires that the ratings of the voltage clamp circuit be larger than necessary and extends the total operating time needed to operate all the IGBTs in the series string.

When solid state switching devices, such as IGBTs, transistors or SCRs (silicon controlled rectifiers), are operated in series, they do not all turn on or turn off at the same time. Unless provisions are made for limiting the voltage drop across each device, the first device to turn off must support the entire system voltage until the other devices turn off. If, during this period, the system voltage is greater than the device voltage rating, the device will fail. The same holds true when the devices are turned on. The last device to be turned on will be subjected to the full system voltage and, if it is greater than the device rating, it will fail.

SUMMARY OF THE INVENTION

The invention is a ripple gate drive circuit that includes a plurality of transistors having their power terminals connected in series across an electrical potential. A plurality of control circuits, each associated with one of the transistors, is provided. Each control circuit is responsive to a control signal and an optical signal received from at least one other control circuit for controlling the conduction of electrical current through the power terminals of the associated transistor. The control circuits are responsive to a first state of the control signal for causing each transistor in series to turn on sequentially and responsive to a second state of the control signal for causing each transistor in series to turn off sequentially.

DETAILED DESCRIPTION OF THE INVENTION

Figure 1:
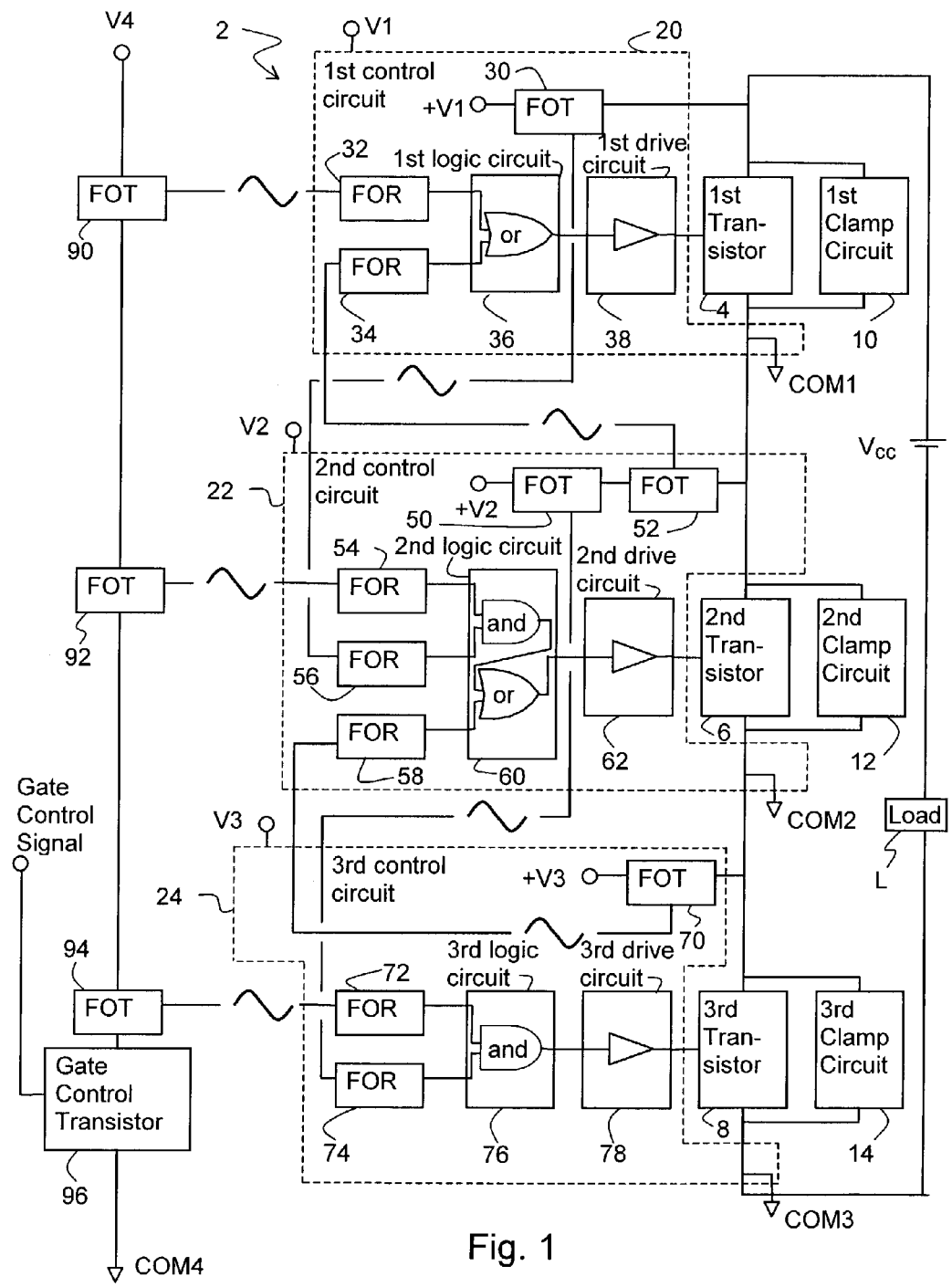
FIG. 1 is a block diagram drawing of a ripple gate drive circuit in accordance with the present invention.

Referring to FIG. 1, a ripple gate drive circuit 2 includes a first transistor 4, a second transistor 6 and a third transistor 8 having their power terminals connected in series across a power source $V_{cc}$. Connected in series with the power terminals of transistors 4 to 8 is a load L. The conduction state of transistors 4 to 8 can be selectively controlled to enable load L to receive power from power source $V_{cc}$.

Ripple gate drive circuit 2 includes a first clamp circuit 10, a second clamp circuit 12 and a third clamp circuit 14 connected between the power terminals of first transistor 4, second transistor 6 and third transistor 8, respectively. Each clamp circuit 10 to 14 is configured to limit the voltage drop across its respective transistor 4 to 8 during conduction in order to avoid damage thereto. In one embodiment, transistors 4 to 8 are insulated gate bipolar transistors (IGBTs). However, this is not to be construed as limiting the invention. Since suitable circuit configurations for implementing the functions of clamp circuits 10 to 14 are well-known in the art, details regarding one or more circuit configurations for clamp circuits 10 to 14 have not been included herein.

Control terminals of transistors 4 to 8 are connected to receive a binary drive signal from a first control circuit 20, a second control circuit 22 and a third control circuit 24, respectively. Desirably, the electrical components of first control circuit 20 receive power from a low level power supply V1 which also includes a ground COM1 which is connected as necessary to the components of first control circuit 20 and to the node formed by the connection of the power terminals of first transistor 4 and second transistor 6. Similarly, the electrical components of second and third control circuits 22 and 24 desirably receive electrical power from low level power supplies V2 and V3 which also include grounds COM2 and COM3 which are connected as necessary to the components of second and third control circuits 22 and 24, respectively. COM2 is connected to the node formed by the connection of the power terminals of second transistor 6 and third transistor 8 whereas COM3 is connected to the other power terminal of third transistor 8.

First control circuit 20 includes a fiber optic transmitter 30, fiber optic receivers 32 and 34, a first logic circuit 36 and a first drive circuit 38. Second control circuit 22 includes fiber optic transmitters 50 and 52, fiber optic receivers 54, 56 and 58, a second logic circuit 60 and a second drive circuit 62. Lastly, third control circuit 24 includes a fiber optic transmitter 70, fiber optic receivers 72 and 74, a third logic circuit 76 and a third drive circuit 78.

In first control circuit 20, fiber optic transmitter 30 either blocks or forwards supply V1. Instead of being directly connected COM1, however, the electrical return path of fiber optic transmitter 30 is connected COM1 through first transistor 4. Similarly, in third control circuit 24, fiber optic transmitter 70 either blocks or forwards power supply V3 and is connected COM3 via third transistor 8. However, in second control circuit 22, fiber optic transmitter 50 either blocks or forwards power supply V2 and is connected COM2 via fiber optic transmitter 52 and second transistor 6.

Fiber optic transmitter 30 has an optical output that is optically coupled to an input of fiber optic receiver 56 of second control circuit 22. Fiber optic transmitter 50 has an optical output that is coupled to an optical input of fiber optic receiver 74 of third control circuit 24. Fiber optic transmitter 52 has an optical output that is coupled to an optical input of fiber optic receiver 34 of first control circuit 20. Lastly, fiber optic transmitter 70 has an optical output that is coupled to an optical input of fiber optic receiver 58 of second control circuit 22.

First logic circuit 36 implements a logical OR on the electrical outputs of fiber optic receivers 32 and 34. The digital signal output by first logic circuit 36 is coupled to an input of first drive circuit 38 which amplifies the digital signal and supplies it as a digital drive signal to a control terminal of first transistor 4. Second logic circuit 60 implements a logical AND function on the electrical outputs of fiber optic receivers 54 and 56 and implements a logical OR on the result of this logical AND function with the electrical output of fiber optic receiver 58. The digital signal output by second logic circuit 90 is coupled to an input of second drive circuit 62 which amplifies the digital signal and supplies it as a digital drive signal to a control terminal of second transistor 6. Third logic circuit 76 logically AND's the electrical output of fiber optic receivers 72 and 74. The digital signal output by third logic circuit 76 is coupled to an input of third drive circuit 78 which amplifies the digital signal and supplies it as a digital drive signal to a control terminal of third transistor 8.

The logical functions performed by logic circuits 36, 60 and 76 can be performed by any suitable arrangement of logic gates. Hence, the simplified illustration of the logic function performed by each logic circuit 36, 60 and 76 is not to be construed as limiting the invention. Similarly, the amplification functions performed by drive circuits 38, 62 and 78 can be implemented in any suitable manner, such as a pair of transistors connected in a push-pull configuration and, therefore, the simplified illustration of an amplifier block in each drive circuit 38, 62 and 78 is not to be construed as limiting the invention. Moreover, the descriptions of low level power supplies V1, V2, V3 and V4 (discussed hereinafter) as being separate power supplies and grounds COM1, COM2, COM3 and COM4 (discussed hereinafter) as being separate grounds are not to be construed as limiting the invention.

Fiber optic receivers 32, 54 and 72 of control circuits 20, 22 and 24, respectively, have optical inputs coupled to optical outputs of fiber optic transmitters 90, 92 and 94, respectively. Fiber optic transmitters 90, 92 and 94 receive electrical power from low level power supply V4, the electrical return path of fiber optic transmitter 90 and the electrical return path of fiber optic transmitter 94, respectively. Fiber optic transmitter 94 also has its electrical return path connected to a ground COM4 of low level power supply V4 via the power terminals of a gate control transistor 96. Gate control transistor 96 has a control input coupled to receive a gate control signal from an external source (not shown). The operation of ripple gate drive circuit 2 will now be described.

Starting from a condition where transistors 4, 6 and 8 are turned off, or not conducting, in response to gate control transistor 96 receiving the gate control signal, electrical current flows from low level power supply V4 COM4 via fiber optic transmitters 90 to 94 and gate control transistor 96. In response to this flow of electrical current, fiber optic transmitters 90 to 94 output optical signals to the optical inputs of fiber optic receivers 32, 54 and 72, respectively. In response to these optical signals, fiber optic receivers 32, 54 and 72 output corresponding electrical signals to logic circuits 36, 60 and 76, respectively. Since first logic circuit 36 implements a logical OR function, in response to receiving the electrical signal from fiber optic receiver 32, first logic circuit 36 outputs a digital signal to first drive circuit 38. First drive circuit 38 amplifies this digital signal and outputs it as the digital drive signal to the control terminal of first transistor 4. In response to receiving this digital drive signal, first transistor 4 turns on, or commences conducting current.

In response to first transistor 4 conducting current, fiber optic transmitter 30 commences conducting current from low level power supply V1 COM1 via first transistor 4. In response to this flow of current, fiber optic transmitter 30 outputs an optical signal to the optical input of fiber optic receiver 56.

In response to receiving optical signals from fiber optic transmitters 92 and 30, fiber optic receivers 54 and 56, respectively, output corresponding electrical signals to the logical AND function of second logic circuit 60. In response to receiving these electrical signals, the logical AND function of second logic circuit 60 outputs a resultant logical AND signal to an input of the logical OR function of second logic circuit 60. It should be noted that the logical AND function of second logic circuit 60 delays the turn-on of second transistor 6 from the onset of the gate control signal until first transistor 4 turns on.

In response to receiving this logical AND signal, the logical OR function of second logic circuit 60 outputs a digital signal to second drive circuit 62. Second drive circuit 62 amplifies this digital signal and outputs it as the digital drive signal to second transistor 6. In response to receiving this digital drive signal, second transistor 6 turns on, or commences conducting current.

In response to second transistor 6 conducting current, fiber optic transmitters 50 and 52 commence conducting current from low level power supply V2 COM2 via second transistor 6. In response to this flow of current, fiber optic transmitters 50 and 52 output optical signals to inputs of fiber optic receivers 74 and 34 of third and first drive control circuits 24 and 20, respectively.

In response to receiving optical signals from fiber optic transmitters 50 and 94, fiber optic receivers 72 and 74 output electrical signals to the logical AND function of third logic circuit 76. In response to receiving these electrical signals, the logical AND function of third logical circuit 76 outputs a digital signal to an input of third drive circuit 78. Third drive circuit 78 amplifies this digital signal and outputs it as the digital drive signal to the control terminal of third transistor 8. In response to receiving this digital drive signal, third transistor 8 commences conducting current. It should be noted that the logical AND function of third logic circuit 76 delays the turn-on of third transistor 8 from the onset of the gate control signal until second transistor 6 is conducting.

In response to third transistor 8 conducting current, fiber optic transmitter 70 commences conducting current from low level power supply V3 COM3 via third transmitter 8. In response to this flow of current, fiber optic transmitter 70 outputs an optical signal to the input of fiber optic receiver 58. In response to this optical signal, fiber optic receiver 58 outputs an electrical signal to the logical OR function of second logic circuit 60 whereupon the turn-on of second transistor 6 is reinforced.

Thus, as can be seen, first, second and third transistors 4, 6 and 8 turn on sequentially in a controlled manner to supply electrical power from power source $V_{cc}$ to load L. The use of optical connections between control circuits 20, 22 and 24 minimizes the delay in the sequential turning on of first, second and third transistors 4, 6 and 8 from the onset of the gate control signal and avoids cross-talk between control circuits 20, 22 and/or 24.

At a suitable time, when it is desired to terminate the supply of electrical power to load L, the binary state of gate control signal changes whereupon gate control transistor 96 terminates conducting thereby causing fiber optic transmitters 90 to 94 to terminate conducting electrical current. In response to terminating this flow of electrical current, fiber optic transmitters 90 to 94 terminate supplying optical signals to the inputs of fiber optic receivers 32, 54 and 72, respectively. In response to terminating the optical signal received by optic receiver 72, the electrical output of fiber optic receiver 72 changes state whereupon the logical AND function of third logic circuit 76 is not satisfied and the output of third logic circuit 76 changes state. In response to this change in state, third drive circuit 78 terminates the digital drive signal to the control terminal of third transistor 8 whereupon third transistor 8 turns off, or terminates conducting current. In response to third transistor 8 turning off, electrical current terminates flowing through fiber optic transmitter 70 whereupon fiber optic transmitter 70 turns off thereby terminating the optical signal output by fiber optic transmitter 70 to fiber optic receiver 58.

Recall that changing the state of the gate control signal terminates the optical signal output by fiber optic transmitter 92 to fiber optic receiver 54. In response to terminating this optical signal, the electrical output of fiber optic receiver 54 changes state whereupon the logical AND function of second logic circuit 60 is not satisfied and the logical AND signal output by the logical AND function of second logic circuit 60 changes state. In response to the change of state of the logical AND signal and the termination of the electrical signal output by fiber optic receiver 58, the logical OR signal output by second logic circuit 60 changes state. In response to the change in state of the logical OR signal, second drive circuit 62 terminates the digital drive signal to the control terminal of second transistor 6 whereupon second transistor 6 turns off, or terminates conducting current. As can be seen, the turning off of second transistor 6 from the termination, or change in state, of the gate control signal is delayed until third transistor 8 turns off.

In response to second transistor 6 turning off, electrical current terminates flowing through fiber optic transmitters 50 and 52 whereupon fiber optic transmitters 50 and 52 turn off thereby terminating the optical signals output by a fiber optic transmitter 50 and 52 to fiber optic receivers 74 and 34, respectively. In response to terminating the optical signal received by fiber optic receiver 74, the electrical output of fiber optic receiver 74 received by the logical AND function of third logic circuit 76 changes state thereby reinforcing the turn-off of third transistor 8.

In response to terminating the optical signal received by fiber optic receiver 34, the electrical output of fiber optic receiver 34 received by the logical OR function of first logic circuit 36 is terminated. Recall that changing the state of the gate control signal terminated the optical signal output by fiber optic transmitter 90 to fiber optic receiver 32. In response to terminating this optical signal, the electrical output of fiber optic receiver 32 is terminated. Since first logic circuit 36 implements a logical OR function, the termination of the electrical output of fiber optic receiver 32 in the presence of the electrical output of fiber optic receiver 34 does not terminate the digital drive signal supplied to first transistor 4 from first drive circuit 38. However, when the electrical output of fiber optic receiver 32 is terminated and the output of fiber optic receiver 34 changes state in response to terminating the optical signal output by fiber optic transmitter 52, the output of the logical OR function of first logic circuit 36 changes state whereupon the digital drive signal supplied to the control terminal of first transistor 4 terminates. In response to this termination, first transistor 4 turns off, or terminates conducting electrical current across its power terminals.

In response to first transistor 4 turning-off, the flow of electrical current through fiber optic transmitter 30 terminates. In response to terminating this electrical current, the optical signal received at the input of fiber optic receiver 56 from fiber optic transmitter 30 terminates whereupon the electrical output of fiber optic receiver 56 changes state thereby reinforcing the turn-off of second transistor 6.

Thus, as can be seen, in response to terminating the gate control signal, third transistor 8, second transistor 6 and first transistor 4 sequentially terminate conducting electrical current across the power terminals thereof in a controlled manner.

Similar ripple gate drive circuits can be constructed having more than three transistors. As in the three-transistor device, a control circuit is associated with each transistor. The first control circuit has a subsequent control circuit; each intervening control circuit has a preceding and a subsequent control circuit, and the final control circuit has a preceding control circuit.

The logic circuit of the first control circuit is responsive to the logical OR combination of the control signal and an optical signal received from the subsequent control circuit for controlling when the transistor associated with the first control circuit turns on and off. The logic circuit of each intervening control circuit is responsive to the logical AND combination of the control signal and an optical signal received from the previous control circuit. The logical AND combination is logically OR'ed with an optical signal received from the subsequent control circuit for controlling when the transistor associated with each intervening control circuit turns on and turns off. The logic circuit of the final control circuit is responsive to the logical AND combination of the control signal and an optical signal received from the previous control circuit for controlling when the transistor associated with the final control circuit turns on and turns off. The control circuits are responsive to a first state of the control signal for causing each transistor in series to turn on sequentially and responsive to a second state of the control signal for causing each transistor in series to tun off sequentially.

The present invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

| S-88, 109 - Numbering Key | |
|---|---|
| No. | Item |
| 1 | |
| 2 | Ripple Gate Drive Circuit |
| 3 | |
| 4 | 1$^{st}$ Transistor |
| 5 | |
| 6 | 2$^{nd}$ Transistor |
| 7 | |

-continued

S-88, 109 - Numbering Key

| No. | Item |
|---|---|
| 8 | 3rd Transistor |
| 9 | |
| 10 | 1st Clamp Circuit |
| 11 | |
| 12 | 2nd Clamp Circuit |
| 13 | |
| 14 | 3rd Clamp Circuit |
| 15 | |
| 16 | |
| 17 | |
| 18 | |
| 19 | |
| 20 | 1st Control Circuit |
| 21 | |
| 22 | 2nd Control Circuit |
| 23 | |
| 24 | 3rd Control Circuit |
| 25 | |
| 26 | |
| 27 | |
| 28 | |
| 29 | |
| 30 | FOT |
| 31 | |
| 32 | FOR |
| 33 | |
| 34 | FOR |
| 35 | |
| 36 | 1st Logic Circuit |
| 37 | |
| 38 | 1st Drive Circuit |
| 39 | |
| 40 | |
| 41 | |
| 42 | |
| 43 | |
| 44 | |
| 45 | |
| 46 | |
| 47 | |
| 48 | |
| 49 | |
| 50 | FOT |
| 51 | |
| 52 | FOT |
| 53 | |
| 54 | FOR |
| 55 | |
| 56 | FOR |
| 57 | |
| 58 | FOR |
| 59 | |
| 60 | 2nd Logic Circuit |
| 61 | |
| 62 | 2nd Drive Circuit |
| 63 | |
| 64 | |
| 65 | |
| 66 | |
| 67 | |
| 68 | |
| 69 | |
| 70 | FOT |
| 71 | |
| 72 | FOR |
| 73 | |
| 74 | FOR |
| 75 | |
| 76 | 3rd Logic Circuit |
| 77 | |
| 78 | 3rd Drive Circuit |
| 79 | |
| 80 | |
| 81 | |
| 82 | |

-continued

S-88, 109 - Numbering Key

| No. | Item |
|---|---|
| 83 | |
| 84 | |
| 85 | |
| 86 | |
| 87 | |
| 88 | |
| 89 | |
| 90 | FOT |
| 91 | |
| 92 | FOT |
| 93 | |
| 94 | FOT |
| 95 | |
| 96 | Gate Control Transistor |
| 97 | |
| 98 | |
| 99 | |
| 100 | |
| 101 | |
| 102 | |
| 103 | |
| 104 | |
| 105 | |
| 106 | |
| 107 | |
| 108 | |
| 109 | |
| 110 | |
| 111 | |
| 112 | |
| 113 | |
| 114 | |
| 115 | |
| 116 | |
| 117 | |
| 118 | |
| 119 | |
| 120 | |
| 121 | |
| 122 | |
| 123 | |
| 124 | |
| 125 | |
| 126 | |
| 127 | |
| 128 | |
| 129 | |
| 130 | |
| 131 | |
| 132 | |
| 133 | |
| 134 | |
| 135 | |
| 136 | |
| 137 | |
| 138 | |
| 139 | |
| 140 | |
| 141 | |
| 142 | |
| 143 | |
| 144 | |
| 145 | |
| 146 | |
| 147 | |
| 148 | |
| 149 | |
| 150 | |

We claim:

1. A ripple gate drive circuit comprising:
   a plurality of control circuits including first, second, and third control circuits;

a plurality of control circuits including first, second, and third transistors having their power terminals connected in series across the electrical potential;

the first, second, and third transistors are responsive to the first, second, and third control circuits, respectively;

the logic circuit of the first control circuit is responsive to the logical OR combination of the control signal and an optical signal received from the second control circuit for controlling when the transistor associated with the first control circuit turns on and turns off;

the logic circuit of the second control circuit is responsive to the logical AND combination of the control signal and an optical signal received from the first control circuit, wherein this logical AND combination is logically OR'ed with an optical signal received from this third control circuit for controlling when the transistor associated with the second control circuit turns on and turns off; and the logic circuit of the third control circuit is responsive to the logical AND combination of the control signal and an optical signal received from the second control circuit for controlling when the transistor associated with the third control circuit turns on and turns off.

2. The circuit of claim 1, wherein:

each control circuit includes a fiber optic transmitter and a fiber optic receiver;

each fiber optic transmitter converts an electrical signal into a corresponding optical signal which is supplied to the fiber optic receiver of another control circuit; and each fiber optic receiver converts a received optical signal into an electrical signal for processing by the logic circuitry of the control circuit.

3. The circuit of claim 2, wherein each control circuit includes another fiber optic receiver for converting an optical signal produced in response to the control signal into a corresponding electrical signal for processing by the logic circuitry of the control circuit.

4. The circuit of claim 1, wherein:

the plurality of control circuits includes first, at least one intervening, and final control circuits;

the final control circuit is arranged subsequent to the at least one intervening control circuit;

the first control circuit is arranged previous to the at least one intervening control circuit; and each of the at least one intervening control circuits is arranged so as to have a previous control circuit to which it is subsequent and a subsequent control circuit to which it is previous;

the first transistor is responsive to the first control circuit;

the final transistor is responsive to the final control circuit;

each of the at least one intervening transistors is responsive to the respective at least one intervening control circuit;

the logic circuit of the first control circuit is responsive to the logical OR combination of the control signal and an optical signal received from the subsequent control circuit for controlling when the transistor associated with the first control circuit turns on and off;

the logic circuit of each intervening control circuit is responsive to the logical AND combination of the control signal and an optical signal received from the previous control circuit, wherein this logical AND combination is logically OR'ed with an optical signal received from the subsequent control circuit for controlling when the transistor associated with each intervening control circuit turns on and turns off; and the logic circuit of the final control circuit is responsive to the logical AND combination of the control signal and an optical signal received from the previous control circuit for controlling when the transistor associated with the final control circuit turns on and turns off.

* * * * *